(12) United States Patent
Tomioka (10) Patent No.: US 9,172,332 B2
(45) Date of Patent: Oct. 27, 2015

(54) OPERATIONAL AMPLIFIER CIRCUIT (71) Applicant: Seiko Instruments Inc., Chiba-shi, Chiba (JP)

(72) Inventor: Tsutomu Tomioka, Chiba (JP)

(73) Assignee: Seiko Instruments Inc. (JP)

( * ) Notice: Subject to any disclaimer, the term of this patent is extended or adjusted under 35 U.S.C. 154(b) by 1 day.

(21) Appl. No.: 14/167,104

(22) Filed: Jan. 29, 2014

(65) Prior Publication Data
US 2014/0210547 A1    Jul. 31, 2014

(30) Foreign Application Priority Data

Jan. 30, 2013 (JP) ................. 2013-016110

(51) Int. Cl.
    H03F 1/02     (2006.01)
    H03F 1/26     (2006.01)
    G06G 7/186    (2006.01)
    H03F 3/387    (2006.01)
    H03F 3/45     (2006.01)

(52) U.S. Cl.
    CPC ............. *H03F 1/26* (2013.01); *G06G 7/186* (2013.01); *H03F 3/387* (2013.01); *H03F 3/45475* (2013.01); *H03F 2203/45138* (2013.01); *H03F 2203/45356* (2013.01); *H03F 2203/45512* (2013.01)

(58) Field of Classification Search
    CPC ............. H03F 3/45475; H03F 2203/45138; H03F 2203/45512; H03F 1/02; H03F 2203/45356; G06G 7/186
    USPC ......... 330/9, 252, 69, 258–259, 303; 327/124
    See application file for complete search history.

(56) References Cited

U.S. PATENT DOCUMENTS

| 7,535,295 B1 * | 5/2009 | Huijsing et al. ............... 330/9 |
| 7,724,080 B2 * | 5/2010 | Luff ............................. 330/9 |
| 8,638,166 B2 * | 1/2014 | Ahmad ........................ 330/9 |
| 2009/0174479 A1 * | 7/2009 | Yan et al. .................. 330/252 |

* cited by examiner

Primary Examiner — Steven J Mottola
Assistant Examiner — Hafizur Rahman
(74) Attorney, Agent, or Firm — Brinks Gilson & Lione (57) ABSTRACT Provided is an operational amplifier circuit having a high tolerance for clock phase difference fluctuations. An FIR filter is used to add an input signal of the FIR filter to a signal obtained by delaying the input signal of the FIR filter. In this manner, chopper noise can be removed. Thus, the operational amplifier circuit may have a high tolerance for clock phase difference fluctuations regardless of the phase difference between clocks for controlling a chopper circuit and the FIR filter.

5 Claims, 7 Drawing Sheets

OPERATIONAL AMPLIFIER CIRCUIT

RELATED APPLICATIONS

This application claims priority under 35 U.S.C. §119 to Japanese Patent Application No. 2013-016110 filed on Jan. 30, 2013, the entire content of which is hereby incorporated by reference.

BACKGROUND OF THE INVENTION

1. Field of the Invention

The present invention relates to an operational amplifier circuit.

2. Description of the Related Art

Figure 8:
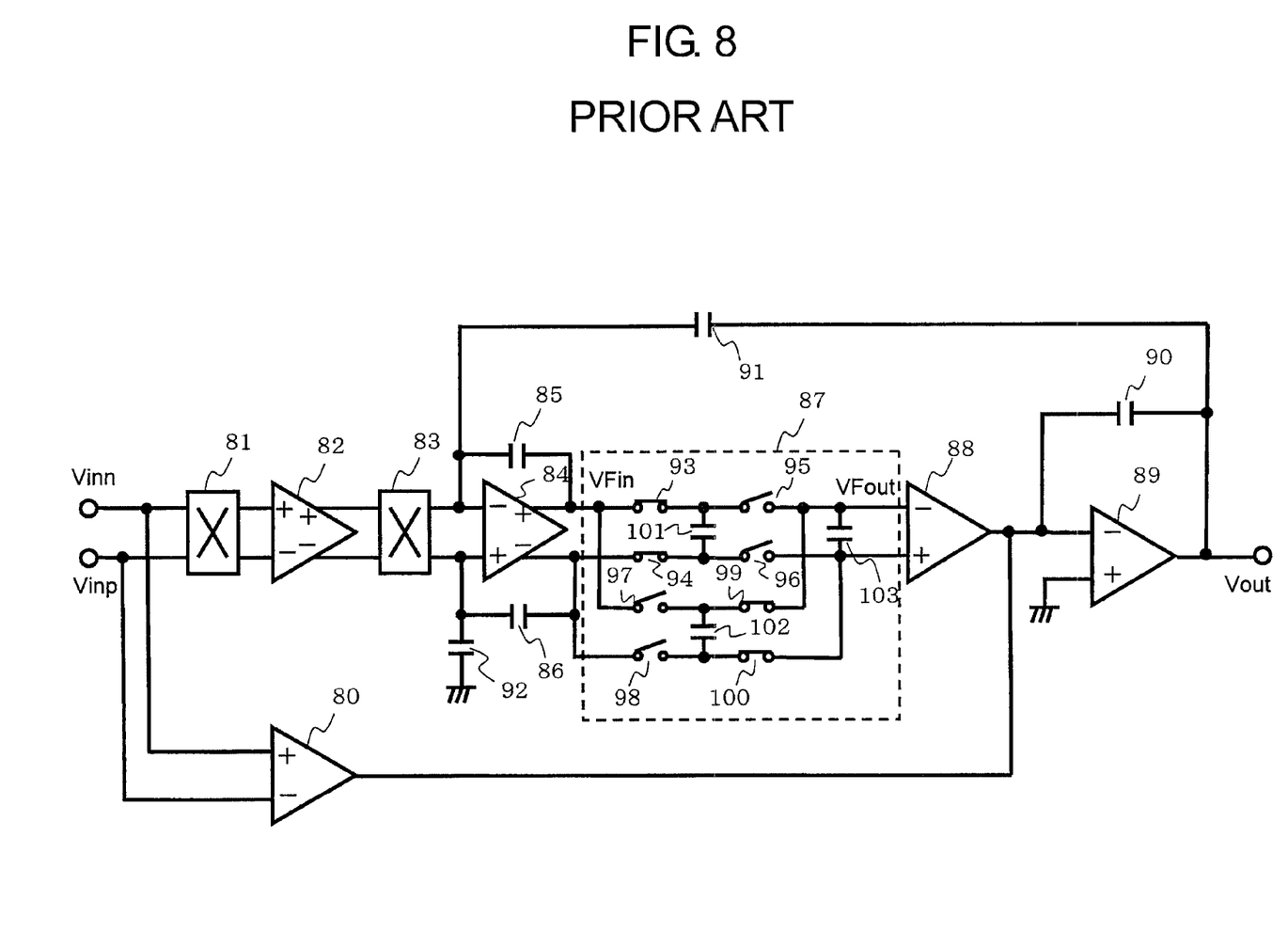
FIG. 8 is a block diagram of a related art operational amplifier circuit.

FIG. 8 is a block diagram illustrating a related art operational amplifier circuit.

When signal voltages are input to input terminals Vinn and Vinp, the signal voltages are subjected to high-frequency modulation by a chopper circuit 81. The modulated signal voltages are input to and amplified by an amplifier stage 82. At this time, together with the modulated signal voltages, an input offset voltage of the amplifier stage 82 is also simultaneously amplified. Output voltages of the amplifier stage 82 are input to a chopper circuit 83, and thus the demodulation of the signal voltages and the high-frequency modulation of the input offset voltage of the amplifier stage 82 are performed. This modulated offset voltage becomes chopper noise. The signal voltages output from the chopper circuit 83 are integrated by an integrating circuit including an amplifier stage 84 and capacitors 85 and 86 to become triangle waves. The outputs of the integrating circuit are input to a switched capacitor notch filter 87. The switched capacitor notch filter 87 includes switches 93 to 100 and capacitors 101 to 103. A control clock for the switches 93, 94, 99, and 100 and a control clock for the switches 95 to 98 have the same frequency as a control clock for the chopper circuits 81 and 83, and have a relationship of inverted waveforms.

In this case, it is assumed that the signal voltage is a DC voltage, and the phase difference between the control clock for the chopper circuits 82 and 83 and the control clock for the switched capacitor notch filter 87 is 90°. At this time, the capacitor 101 and the capacitor 102 store charges of a fixed point of the periodical signal voltage of the switched capacitor notch filter 87, and transmit the charges to the capacitor 103. Therefore, the charges accumulated in the capacitor 103 are always constant. With this, the input offset voltage component of the amplifier stage 82 is removed.

A difference between the signal voltages output from the switched capacitor notch filter 87 is amplified by an amplifier stage 88, and is added with a signal voltage difference amplified by an amplifier stage 80. Further, the signal voltage thus obtained is amplified by an amplifier stage 89 to become an output voltage of the operational amplifier circuit. The input offset voltage of the amplifier stage 82 has been removed, and hence when the operational amplifier circuit is used while applying feedback thereto, the input offset voltage of the operational amplifier may seem small. Further, at this time, the chopper noise caused by modulating the input offset voltage of the amplifier stage 82 is also removed by the switched capacitor notch filter 87.

In the related art operational amplifier circuit illustrated in FIG. 8, when the phase difference between the control clock for the chopper circuits 81 and 83 and the control clock for the switched capacitor notch filter is shifted from 90°, the charges to be stored during the storing period are different between the capacitor 101 and the capacitor 102. Therefore, the capacitor 103 cannot store charges of a fixed point, and the charges periodically change. Therefore, chopper noise is generated in the output of the switched capacitor notch filter 87.

SUMMARY OF THE INVENTION

The present invention has been made in view of the above-mentioned problem, and provides an operational amplifier circuit capable of removing chopper noise regardless of a phase difference between a control clock for chopper circuits and a control clock for a switched capacitor notch filter.

In order to solve the above-mentioned problem, one embodiment of the present invention provides an operational amplifier circuit having the following structure.

Specifically, the operational amplifier circuit includes: a first amplifier stage connected to the input terminals of the operational amplifier circuit; a first chopper circuit that is connected to the input terminals of the operational amplifier circuit and controlled by a first clock, the first chopper circuit having a function of modulating input signals; a second amplifier stage connected to output terminals of the first chopper circuit; a second chopper circuit that is connected to output terminals of the second amplifier stage and controlled by the first clock, the second chopper circuit having a function of demodulating input signals; an integrating circuit that is connected to output terminals of the second chopper circuit and has a function of integrating input signals; an FIR filter connected to output terminals of the integrating circuit; a third amplifier stage connected to output terminals of the FIR filter; and a fourth amplifier stage that is connected to an output terminal of the first amplifier stage and an output terminal of the third amplifier stage, and has an output terminal connected to the output terminal of the operational amplifier circuit.

In the operational amplifier circuit structured as described above according to one embodiment of the present invention, the FIR filter is used to add an input signal of the FIR filter to a signal obtained by delaying the input signal of the FIR filter. In this manner, chopper noise can be removed. Therefore, it is possible to provide the operational amplifier circuit having a high tolerance for clock phase difference fluctuations.

DETAILED DESCRIPTION OF THE PREFERRED EMBODIMENT

Now, an embodiment of the present invention is described with reference to the drawings.

Figure 1:
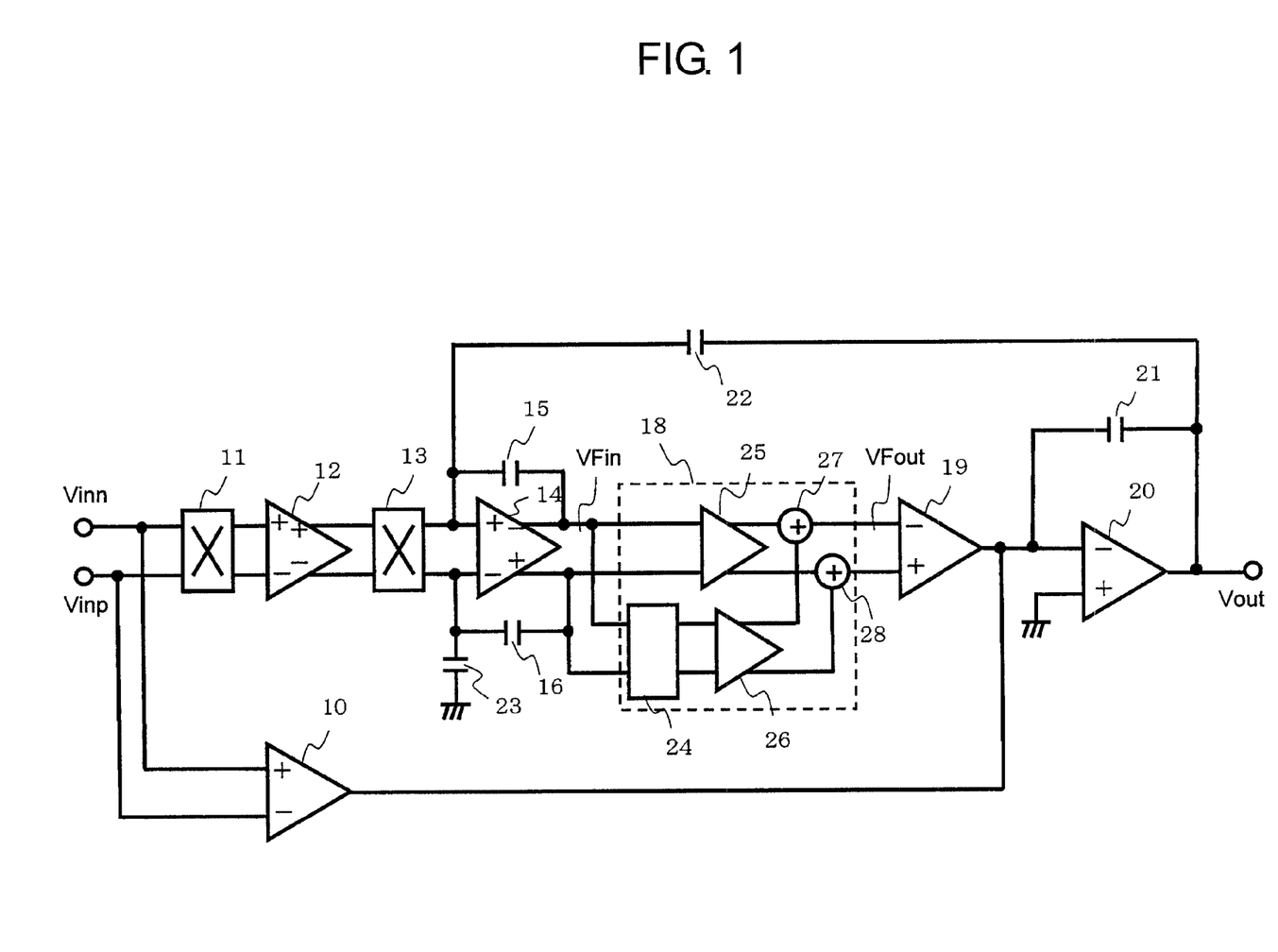
FIG. 1 is a block diagram illustrating an operational amplifier circuit according to an embodiment of the present invention.

FIG. 1 is a block diagram illustrating an operational amplifier circuit according to this embodiment.

The operational amplifier circuit of this embodiment includes an amplifier stage 10, a chopper circuit 11, an amplifier stage 12, a chopper circuit 13, an integrating circuit including an amplifier stage 14, a capacitor 15, and a capacitor 16, an FIR filter 18 including a delay circuit 24, a weighting circuit 25, a weighting circuit 26, an adder circuit 27, and an adder circuit 28, an amplifier stage 19, an amplifier stage 20, a phase compensating capacitor 21, a phase compensating capacitor 22, and a phase compensating capacitor 23.

The chopper circuit 11 has input terminals connected to respective input terminals Vinn and Vinp of the operational amplifier circuit. The amplifier stage 12 has input terminals connected to respective output terminals of the chopper circuit 11. The chopper circuit 13 has input terminals connected to respective output terminals of the amplifier stage 12. The integrating circuit including the amplifier stage 14, the capacitor 15, and the capacitor 16 has input terminals connected to respective output terminals of the chopper circuit 13. The weighting circuit 25 has input terminals connected to respective output terminals of the amplifier stage 14. The delay circuit 24 has input terminals connected to the respective output terminals of the amplifier stage 14. The weighting circuit 26 has input terminals connected to respective output terminals of the delay circuit 24. The adder circuit 27 has input terminals connected to a first output terminal of the weighting circuit 25 and a first output terminal of the weighting circuit 26, respectively. The adder circuit 28 has input terminals connected to a second output terminal of the weighting circuit 25 and a second output terminal of the weighting circuit 26, respectively. The amplifier stage 19 has input terminals connected to respective output terminals of the adder circuits 27 and 28. The amplifier stage 10 has input terminals connected to the respective input terminals Vinn and Vinp of the operational amplifier circuit. The amplifier stage 20 has one input terminal connected to an output terminal of the amplifier stage 10 and an output terminal of the amplifier stage 19. The amplifier stage 20 has another input terminal connected to a ground terminal. The operational amplifier circuit has an output terminal Vout connected to an output terminal of the amplifier stage 20. The phase compensating capacitor 21 is connected between the output terminal and the one input terminal of the amplifier stage 20. The phase compensating capacitor 22 is connected between the output terminal of the amplifier stage 20 and one input terminal of the amplifier stage 14. The phase compensating capacitor 23 is connected between another input terminal of the amplifier stage 14 and the ground terminal.

The delay circuit 24, the weighting circuits 25 and 26, and the adder circuits 27 and 28 constitute the FIR filter 18. The weighting circuits 25 and 26 are each constituted of an amplifier having a gain of 0.5 in this case.

Next, the operation of the operational amplifier circuit of this embodiment is described.

Figure 2:
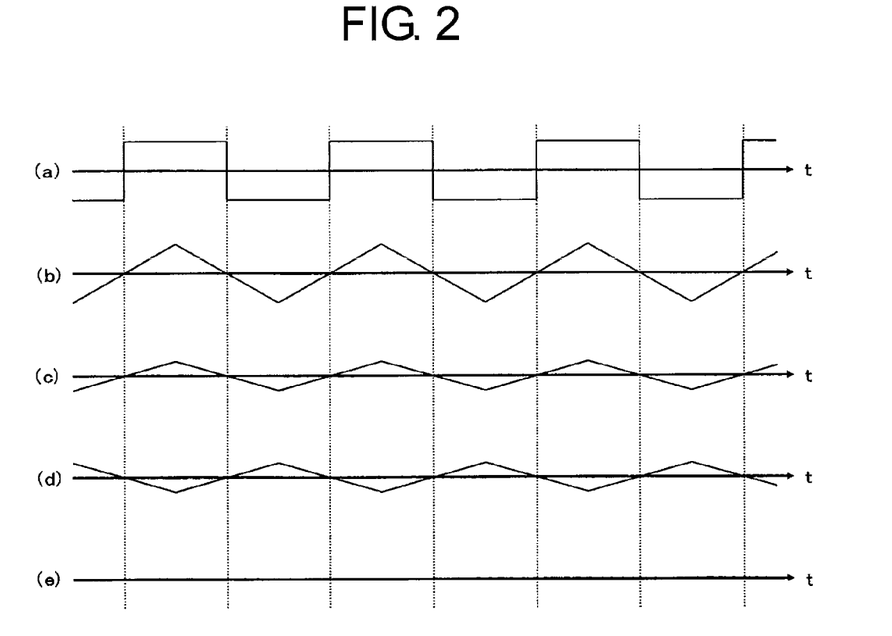
FIG. 2 is a timing chart illustrating input offset voltage removal of the operational amplifier circuit according to the embodiment of the present invention.

FIG. 2 is a timing chart illustrating input offset voltage removal of the operational amplifier circuit of this embodiment. FIG. 2 illustrates the removal of an input offset voltage Vos of the amplifier stage 12 when an input signal voltage Vin is 0.

In this case, the input offset voltage of the amplifier stage 12 is assumed as 0 V. A waveform (a) indicates a control clock for the chopper circuits 11 and 13. The input signal voltage Vin is modulated by the chopper circuit 11, amplified by the amplifier stage 12, and demodulated by the chopper circuit 13. The input offset voltage Vos of the amplifier stage 12 is amplified by the amplifier stage 12, and modulated by the chopper circuit 13. Then, the input signal voltage Vin and the input offset voltage Vos of the amplifier stage 12 are integrated by the integrating circuit, and are added to be output as a voltage. A waveform (b) indicates a voltage VFin of the output terminal of the integrating circuit. The input signal voltage Vin is assumed as 0, and hence also the output of the integrating circuit has the component of the input signal voltage Vin of 0 V, and the waveform (b) of the output terminal of the integrating circuit has only the component of the input offset voltage Vos of the amplifier stage 12. The waveform (b) of the output terminal of the integrating circuit is input to the input terminal of the FIR filter 18. In this case, it is assumed that the gain of each of the weighting circuit 25 and the weighting circuit 26 is 0.5, and the delay time period of the delay circuit 24 is a half period of the control clock (a) for the chopper circuits 11 and 13. A waveform (c) indicates a voltage of the output terminal of the weighting circuit 25. The waveform (c) becomes a voltage obtained by multiplying the waveform (b) of the output terminal of the integrating circuit by 0.5. Further, a waveform (d) indicates a voltage of the output terminal of the weighting circuit 26. The waveform (d) becomes a voltage obtained by delaying, by the delay circuit 24, the waveform (b) of the output terminal of the integrating circuit by a half period of the control clock (a) and multiplying the delayed voltage by 0.5. The waveform (c) of the weighting circuit 25 and the waveform (d) of the weighting circuit 26 are voltages having the same amplitude and inverted polarities. A waveform (e) indicates a voltage VFout of the output terminal of the adder circuit 27. The waveform (e) is a voltage obtained by adding the waveform (c) of the weighting circuit 25 and the waveform (d) of the weighting circuit 26. Therefore, the voltage VFout of the output terminal of the adder circuit 27 is 0 V. This represents that the input offset voltage Vos of the amplifier stage 12 is removed.

Figure 3:
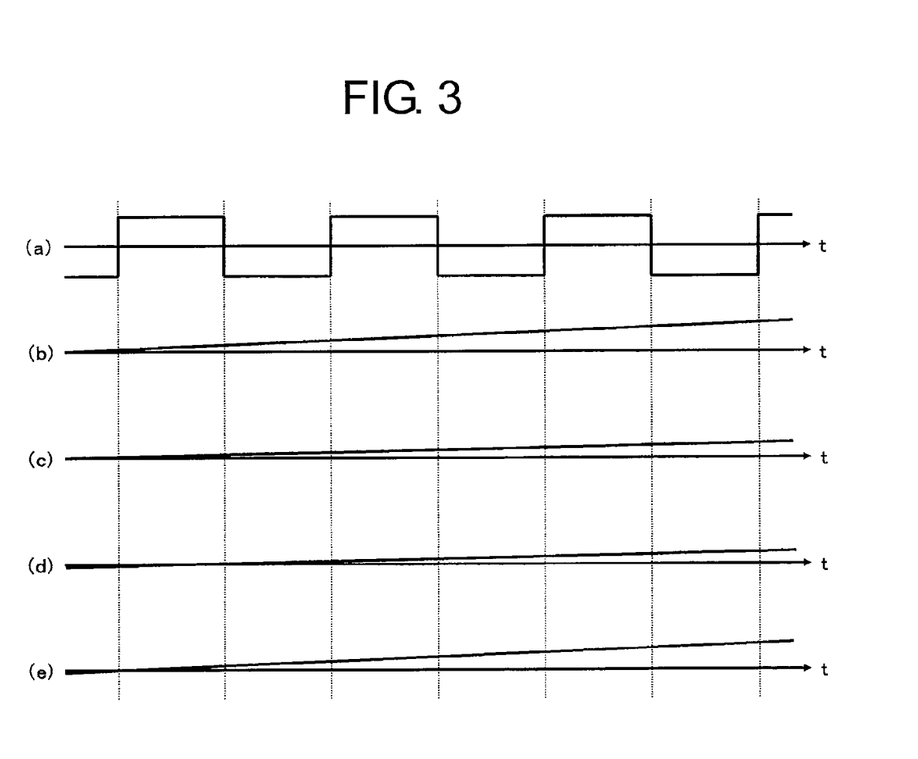
FIG. 3 is a timing chart illustrating input signal amplification of the operational amplifier circuit according to the embodiment of the present invention.

FIG. 3 is a timing chart illustrating amplification of the input signal voltage Vin in a case where the input offset voltage of each of the amplifier stage 12 and the amplifier stage 14 is assumed as 0 V. A waveform (a) indicates a control clock for the chopper circuits 11 and 13. It is assumed that the frequency of the input signal voltage Vin is sufficiently lower than that of the control clock (a). A waveform (b) indicates a voltage VFin of the output terminal of the integrating circuit. The waveform (b) indicates a voltage obtained by subjecting the input signal voltage Vin to modulation by the chopper circuit 11, amplification by the amplifier stage 12, demodulation by the chopper circuit 13, and integration by the integrating circuit. The input signal voltage Vin has a frequency sufficiently lower than that of the control clock (a), and hence the input signal voltage Vin is hardly affected by the modulation by the chopper circuit 11 and the demodulation by the chopper circuit 13. A waveform (c) indicates a voltage of the output terminal of the weighting circuit 25. The waveform (c) is a voltage obtained by multiplying the waveform (b) of the output terminal of the integrating circuit by 0.5. Further, a waveform (d) indicates a voltage of the output terminal of the weighting circuit 26. The waveform (d) becomes a voltage obtained by delaying, by the delay circuit 24, the waveform (b) of the output terminal of the integrating circuit by a half period of the control clock (a) and multiplying the delayed voltage by 0.5. A waveform (e) indicates a voltage VFout of the output terminal of the adder circuit 27. The waveform (e) is a voltage obtained by adding the waveform (c) of the output terminal of the weighting circuit 25 and the waveform (d) of the output terminal of the weighting circuit 26. The waveform (e) becomes a voltage that is substantially equal to the waveform (b) of the output terminal of the integrating circuit. This represents that the input signal voltage is substantially linearly amplified.

The above description represents that the operational amplifier circuit according to the embodiment of the present invention can amplify the input signal voltage Vin while removing the input offset voltage of the amplifier stage 12.

Figure 4:
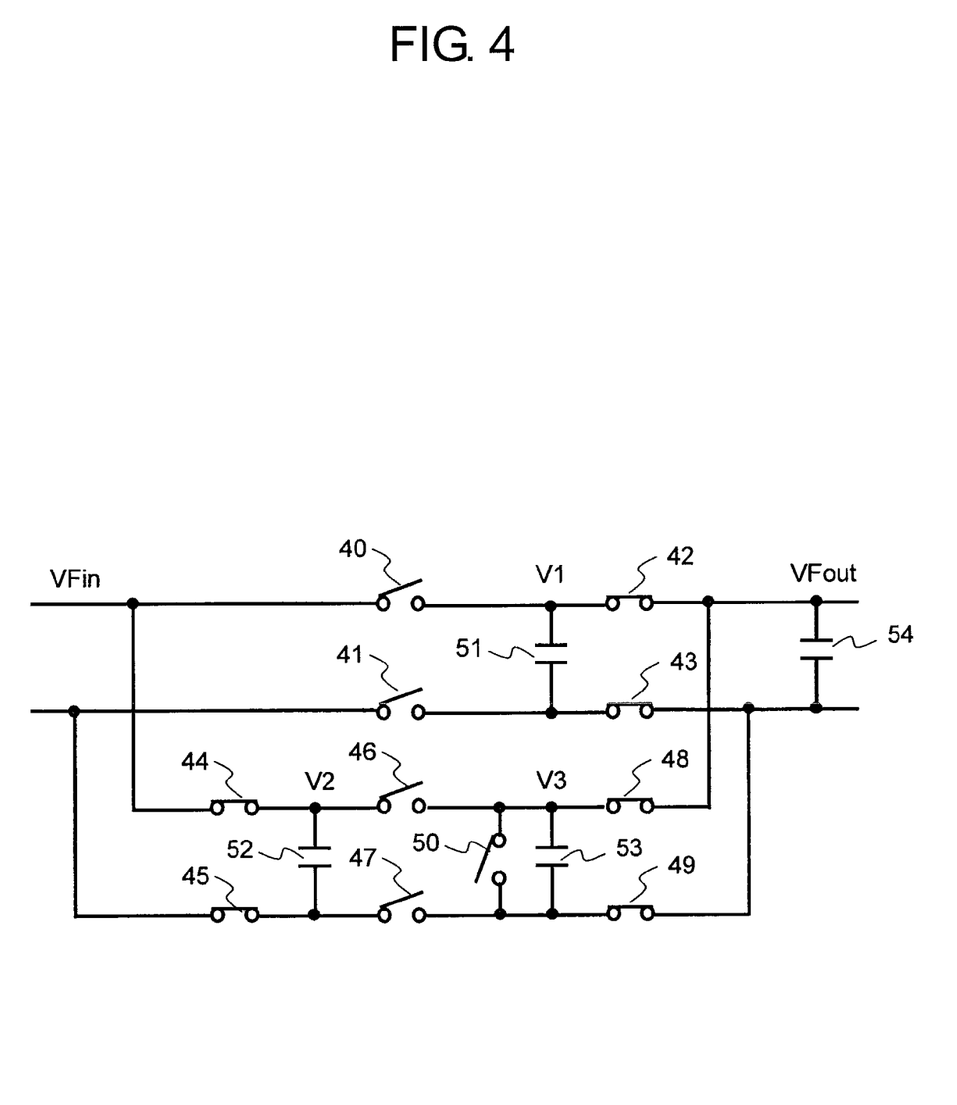
FIG. 4 is a circuit diagram illustrating another example of an FIR filter of the operational amplifier circuit according to the embodiment of the present invention.

FIG. 4 is a circuit diagram illustrating another example of the FIR filter 18 of the operational amplifier circuit of this embodiment. The FIR filter 18 of FIG. 4 includes switches 40 to 50 and capacitors 51 to 54.

The weighting circuit 25 includes the switches 40 and 41 and the capacitor 51. The delay circuit 24 and the weighting circuit 26 include switches 44 to 47 and capacitors 52 and 53. The adder circuit 27 includes the switches 42, 43, 48, and 49 and the capacitor 54. The switch 50 is a switch for resetting the capacitor 53.

Figure 5:
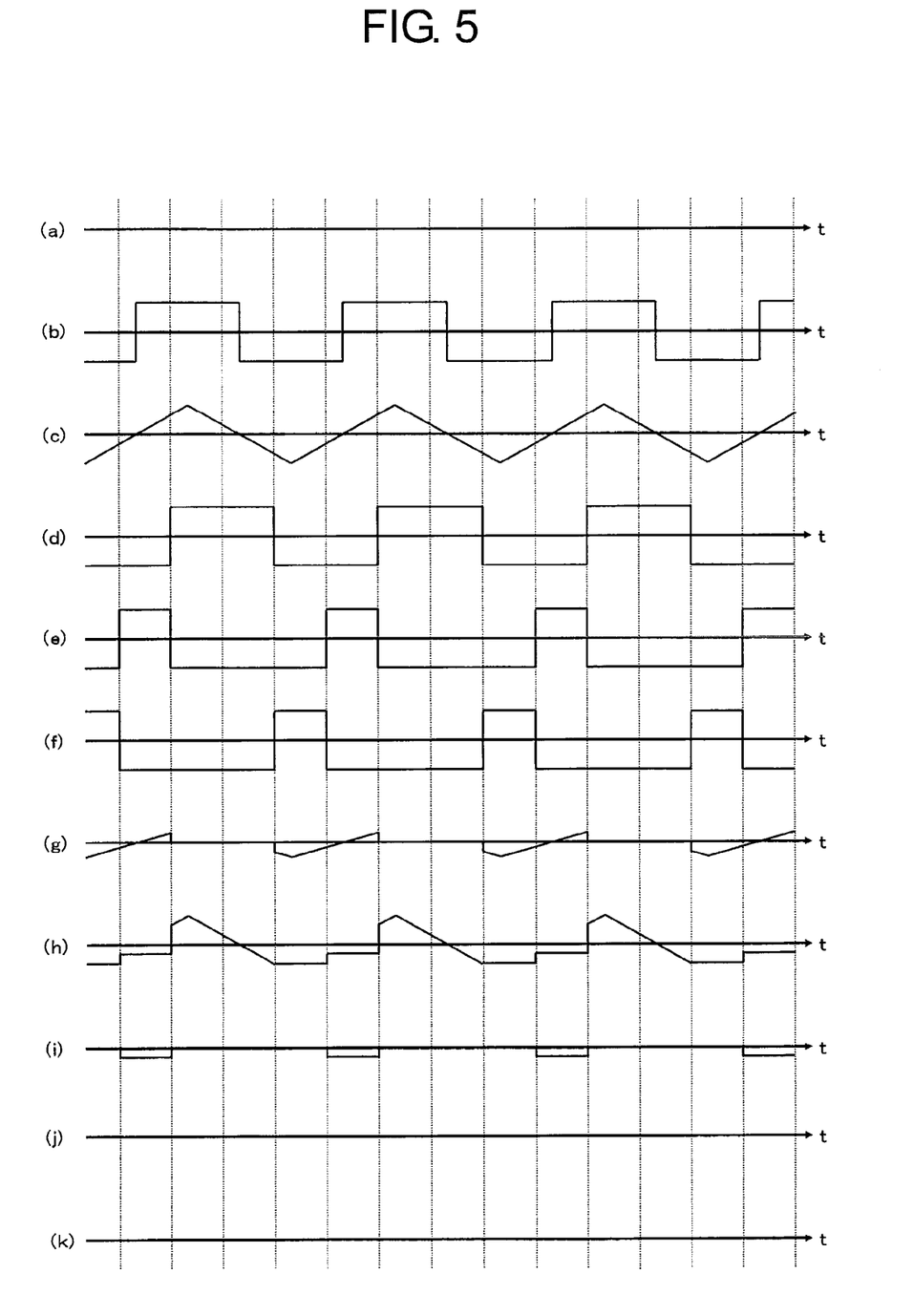
FIG. 5 is a timing chart illustrating input offset voltage removal of the operational amplifier circuit according to the embodiment of the present invention, which uses the another example of the FIR filter.

FIG. 5 is a timing chart illustrating input offset voltage removal of the operational amplifier circuit of this embodiment, which uses the FIR filter 18 of FIG. 4. The removal of the input offset voltage Vos of the amplifier stage 12 when the input signal voltage Vin is 0 is described.

A waveform (a) indicates the input signal voltage Vin of the operational amplifier circuit. In this case, the input offset voltage of the amplifier stage 12 is assumed as 0 V. Further, the capacitor 52 and the capacitor 53 have the same capacitance value, and the capacitor 51 has a capacitance value that is ½ of the capacitance value of the capacitors 52 and 53. A waveform (b) is a control clock for the chopper circuits 11 and 13. A waveform (c) indicates a voltage VFin of the output terminal of the integrating circuit.

A waveform (d) is a control clock for the switches 42 to 45 and the switches 48 and 49, a waveform (e) is a control clock for the switches 46 and 47, and a waveform (f) is a control clock for the switch 50. The switches 40 and 41 are controlled by a clock obtained by inverting the control clock (d). The control clock (d) is a voltage obtained by shifting the control clock (b) by a phase of a fixed time period. The control clock (e) and the control clock (f) become High for a period of ¼ of the period of the control clock (d) when the control clock (d) is Low.

When the voltage of the waveform (c) is input, the FIR filter 18 of FIG. 4 operates as follows. A waveform (g) indicates a voltage V1 of the capacitor 51. A waveform (h) indicates a voltage V2 of the capacitor 52. A waveform (i) indicates a voltage V3 of the capacitor 53. A waveform (j) indicates a voltage VFout of the capacitor 54.

The voltage of the capacitor 51 follows the voltage of the output terminal of the integrating circuit when the control clock (d) is Low. The voltage of the capacitor 52 follows the voltage of the output terminal of the integrating circuit when the control clock (d) is High. The voltage of the capacitor 53 is reset when the control clock (d) is Low and the control clock (f) is High. Then, when the control clock (d) is Low and the control clock (e) is High, the voltage of the capacitor 52 and the voltage of the capacitor 53 are averaged (waveform (i)). Then, when the control clock (d) is High, the voltage of the capacitor 51 and the voltage of the capacitor 53 are averaged by the capacitor 54 (waveform (j)). In this case, the capacitor 52 and the capacitor 53 have the same capacitance value, and the capacitor 51 has a capacitance value that is ½ of the capacitance value of the capacitors 52 and 53. Therefore, the voltage VFout of the capacitor 54 is always zero. That is, the voltage of the output terminal of the FIR filter 18 is 0 V. This represents that the input offset voltage Vos of the amplifier stage 12 is removed. Further, it is possible to remove the input offset voltage Vos of the amplifier stage 12 regardless of the phase difference between the control clock (b) and the control clock (d) of the chopper circuits 11 and 13. Therefore, the operational amplifier circuit has a high tolerance structure for phase difference fluctuations.

Figure 6:
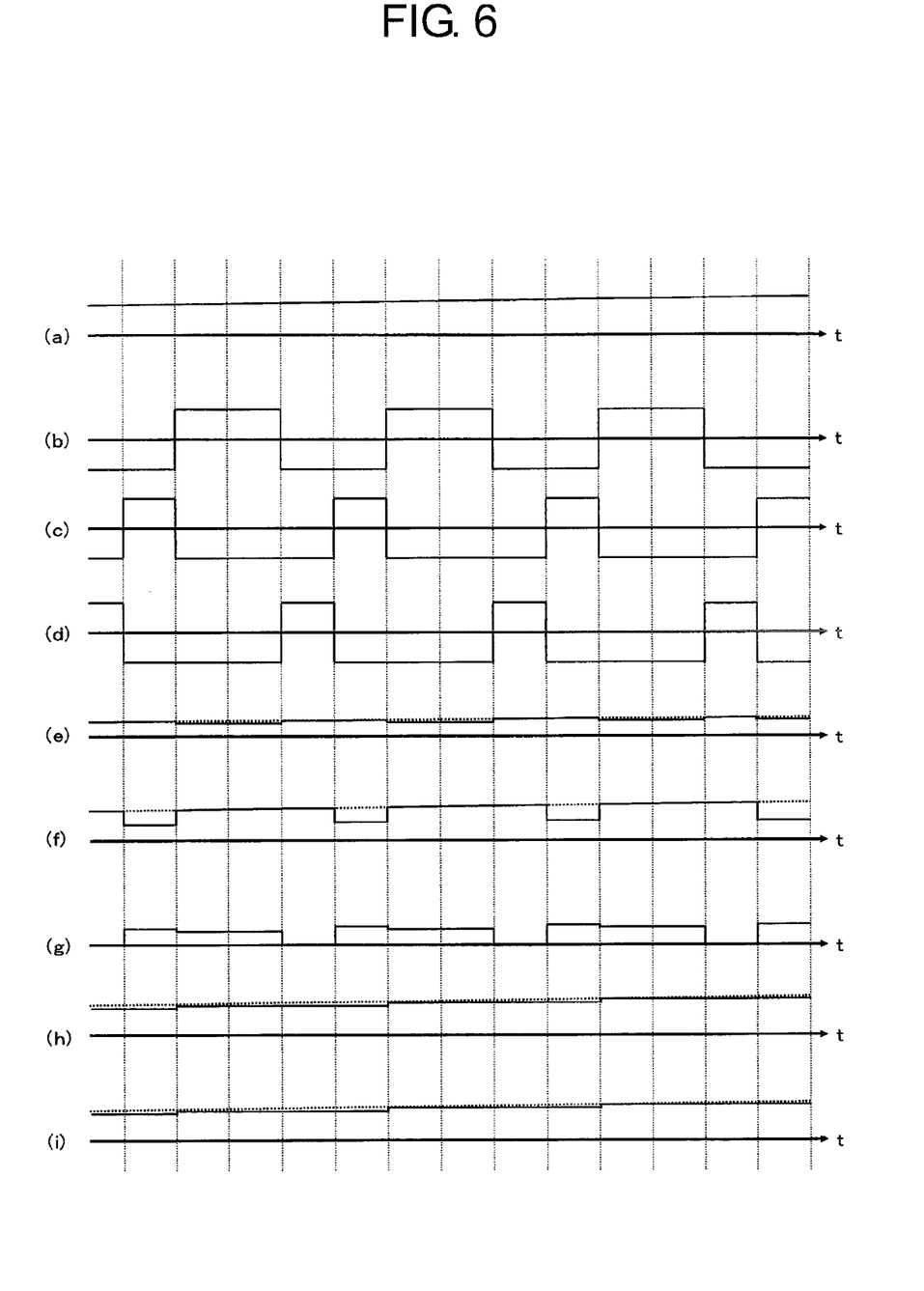
FIG. 6 is a timing chart illustrating input signal amplification of the operational amplifier circuit according to the embodiment of the present invention, which uses the another example of the FIR filter.

Similarly to FIG. 3, FIG. 6 is a timing chart illustrating amplification of the input signal voltage Vin in a case where the input offset voltage of each of the amplifier stage 12 and the amplifier stage 14 is assumed as 0 V. A waveform (a) indicates the input signal voltage Vin of the operational amplifier circuit. It is assumed that the frequency of the input signal voltage Vin is sufficiently lower than that of the control clock (b) for the chopper circuit 11 and 13.

A waveform (e) indicates a voltage V1 of the capacitor 51. A waveform (f) indicates a voltage V2 of the capacitor 52. A waveform (g) indicates a voltage V3 of the capacitor 53. A waveform (h) indicates a voltage VFout of the capacitor 54. A waveform (i) indicates a voltage of the output terminal of the FIR filter 18. The voltage of the output terminal of the FIR filter 18 becomes a voltage that is substantially equal to the voltage of the output terminal of the integrating circuit. This represents that the input signal voltage Vin is substantially linearly amplified.

The above description represents that the operational amplifier circuit can amplify the input signal voltage Vin while removing the input offset voltage of the amplifier stage 12. Further, the above description represents that the input offset voltage of the amplifier stage 12 can be removed regardless of the phase difference between the control clock (b) and the control clock (d) of the chopper circuits 11 and 13, and that the operational amplifier circuit has a high tolerance structure for phase difference fluctuations.

Figure 7:
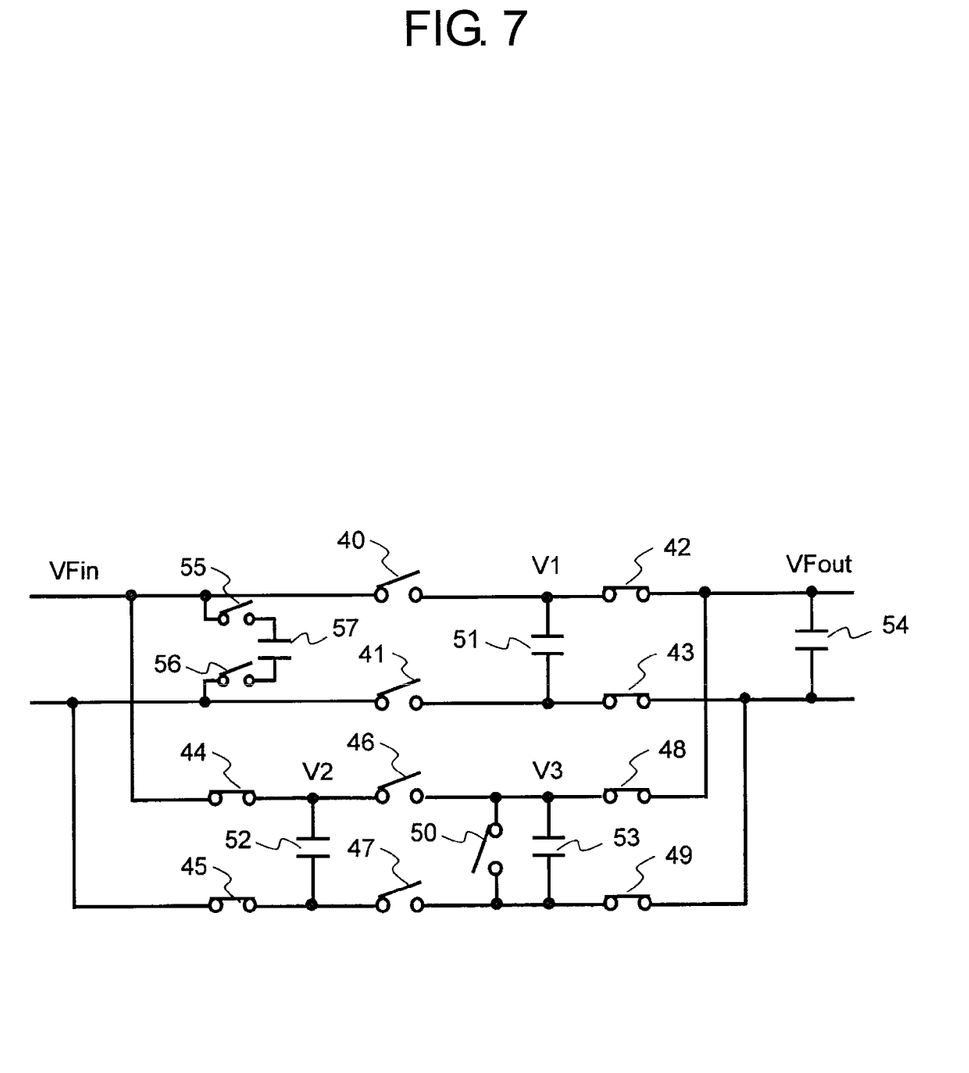
FIG. 7 is a circuit diagram illustrating further another example of the FIR filter of the operational amplifier circuit according to the embodiment of the present invention.

FIG. 7 is a circuit diagram illustrating further another example of the FIR filter of the operational amplifier circuit of this embodiment.

The FIR filter 18 of FIG. 7 is obtained by adding switches 55 and 56 and a capacitor 57 to the circuit of FIG. 4. The capacitance value of the capacitor 57 is equal to the capacitance value of the capacitor 51. The switches 55 and 56 are controlled by a voltage obtained by inverting the control clock (a) similarly to the switches 40 and 41. With this, the capacitance value seen by looking into the input side of the FIR filter 18 is the capacitance value of the capacitor 52 when the control clock (a) is High, and is the capacitance value of the capacitor 51 and the capacitor 57 when the control clock (a) is Low. This represents that the capacitance value seen by looking into the input side of the FIR filter 18 is always constant.

What is claimed is:

1. An operational amplifier circuit for amplifying a difference between signals input to input terminals and outputting the amplified difference from an output terminal, the operational amplifier circuit comprising:
   a first amplifier stage connected to the input terminals of the operational amplifier circuit;
   a first chopper circuit that is connected to the input terminals of the operational amplifier circuit and controlled by a first clock, the first chopper circuit having a function of modulating input signals;

a second amplifier stage connected to output terminals of the first chopper circuit;

a second chopper circuit that is connected to output terminals of the second amplifier stage and controlled by the first clock, the second chopper circuit having a function of demodulating input signals;

an integrating circuit that is connected to output terminals of the second chopper circuit and has a function of integrating input signals;

an FIR filter connected to output terminals of the integrating circuit;

a third amplifier stage connected to output terminals of the FIR filter; and a fourth amplifier stage that is connected to an output terminal of the first amplifier stage and an output terminal of the third amplifier stage, and has an output terminal connected to the output terminal of the operational amplifier circuit;

wherein the FIR filter comprises:

a first weighting circuit that is connected to input terminals of the FIR filter and has a fixed gain;

a delay circuit that is connected to the input terminals of the FIR filter and has a function of delaying an input signal for a fixed period of time and outputting the delayed signal;

a second weighting circuit that is connected to output terminals of the delay circuit and has a fixed gain; and an adder circuit that is connected to an output terminal of the first weighting circuit and an output terminal of the second weighting circuit, and has a function of adding input signals.

2. An operational amplifier circuit according to claim 1, wherein the FIR filter comprises:

a first switch that is connected to input terminals of the FIR filter and is controlled by a second clock that has the same waveform as the first clock and a phase different from a phase of the first clock;

a first capacitor connected to an output terminal of the first switch;

a second switch that is connected to the output terminal of the first switch and is controlled by a third clock obtained by inverting a polarity of the second clock;

a third switch that is connected to the input terminals of the FIR filter and is controlled by the third clock;

a second capacitor connected to an output terminal of the third switch;

a fourth switch that is connected to the output terminal of the third switch and is controlled by a fourth clock synchronized with the third clock;

a third capacitor connected to an output terminal of the fourth switch;

a fifth switch that is connected to the output terminal of the fourth switch and is controlled by the third clock;

a fourth capacitor connected to an output terminal of the second switch and an output terminal of the fifth switch; and a sixth switch that is connected to both ends of the third capacitor and controlled by a fifth clock synchronized with the third clock.

3. An operational amplifier circuit according to claim 2, further comprising a seventh switch and a seventh capacitor that are connected to the input terminals of the FIR filter and controlled by the second clock, the seventh switch and the seventh capacitor being connected in series.

4. An operational amplifier circuit according to claim 1, further comprising:

a first phase compensating capacitor having one end connected to the output terminal of the operational amplifier circuit, and another end connected to an input terminal of the fourth amplifier stage; and a second phase compensating capacitor having one end connected to the output terminal of the operational amplifier circuit, and another end connected to one of the output terminals of the second amplifier stage.

5. An operational amplifier circuit according to claim 1, wherein the integrating circuit comprises:

a fifth amplifier stage having an input terminal connected to an input terminal of the integrating circuit; and a third phase compensating capacitor having one end connected to an output terminal of the fifth amplifier stage and another end connected to the input terminal of the fifth amplifier stage.

* * * * *